US006891405B2

(12) United States Patent
Fujimura et al.

(10) Patent No.: US 6,891,405 B2
(45) Date of Patent: May 10, 2005

(54) VARIABLE GAIN AMPLIFIER

(75) Inventors: Kazuhiro Fujimura, Kanagawa (JP); Shinichi Tanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 22 days.

(21) Appl. No.: 10/191,455

(22) Filed: Jul. 10, 2002

(65) Prior Publication Data

US 2003/0034841 A1 Feb. 20, 2003

(30) Foreign Application Priority Data

Jul. 10, 2001 (JP) ..................................... P2001-209702

(51) Int. Cl.[7] ................................................ H03F 3/45
(52) U.S. Cl. ............................ 327/52; 327/65; 327/563
(58) Field of Search ........................... 327/52, 65, 563; 330/252, 254, 261, 267, 273

(56) References Cited

U.S. PATENT DOCUMENTS

| 4,227,256 A | | 10/1980 | O'keefe .................... 455/250.1 |
| 5,043,602 A | * | 8/1991 | Flannagan ................... 326/126 |
| 5,999,044 A | * | 12/1999 | Wohlfarth et al. ........... 327/563 |

FOREIGN PATENT DOCUMENTS

| EP | 0 317 759 | 10/1988 |
| EP | 0 730 345 A2 | 9/1996 |

OTHER PUBLICATIONS

Integrated Electronics: Analog and Digital circuits and systems, Jacob Millman and Christo C. Halkias, McGraw–Hill, 1972.*

European Search Report.

* cited by examiner

*Primary Examiner*—Tuan T. Lam
*Assistant Examiner*—Hiep Nguyen
(74) *Attorney, Agent, or Firm*—Rader, Fishman & Grauer PLLC; Ronald P. Kananen (57) ABSTRACT

The present invention provides systems and methods related to a variable gain amplifier. The variable gain amplifier includes a first differential amplifier, a second differential amplifier, a combining circuit, and a current control circuit. The first differential amplifier circuit and the second differential amplifier circuit share a common input signal and have different amplification degrees. Each of the first and second differential amplifier circuits includes a first transistor and a second transistor that form a differential pair. The first transistor and the second transistor of each differential amplifier circuit have bases that are supplied with the input signal, and collectors that output signals to the combining circuit. The current control circuit changes a ratio between a bias current of the first differential amplifier circuit and a bias current of said second differential amplifier circuit based on a gain control signal.

9 Claims, 6 Drawing Sheets

VARIABLE GAIN AMPLIFIER

BACKGROUND OF THE INVENTION

The present invention relates to a variable gain amplifier for use in an AGC circuit or the like.

When a demodulator in a communication apparatus, for example, demodulates a received signal, the received signal is controlled so as to make the signal level of the received signal as constant as possible and then inputted to the demodulator. Thus making the signal level constant improves reliability in demodulation. Also, adjusting the signal to an appropriate level improves the SN ratio (signal-to-noise ratio) and prevents signal distortion due to saturation, so that reliability in demodulation can be improved also in these respects. Conventionally, an AGC (Automatic Gain Control) circuit is used to make the signal level of a received signal constant. As is well known, the AGC circuit is formed by a variable gain amplifier.

Such a variable gain amplifier is required to amplify a signal at a low level with a high SN ratio and amplify a signal at a high level without causing distortion due to saturation. In order to satisfy these conditions contrary to each other at the same time, a conventional technique is known which uses a combination of a first amplifier circuit having good noise characteristics and a high gain and a second amplifier circuit having a high input saturation level and a low gain.

Figure 5:
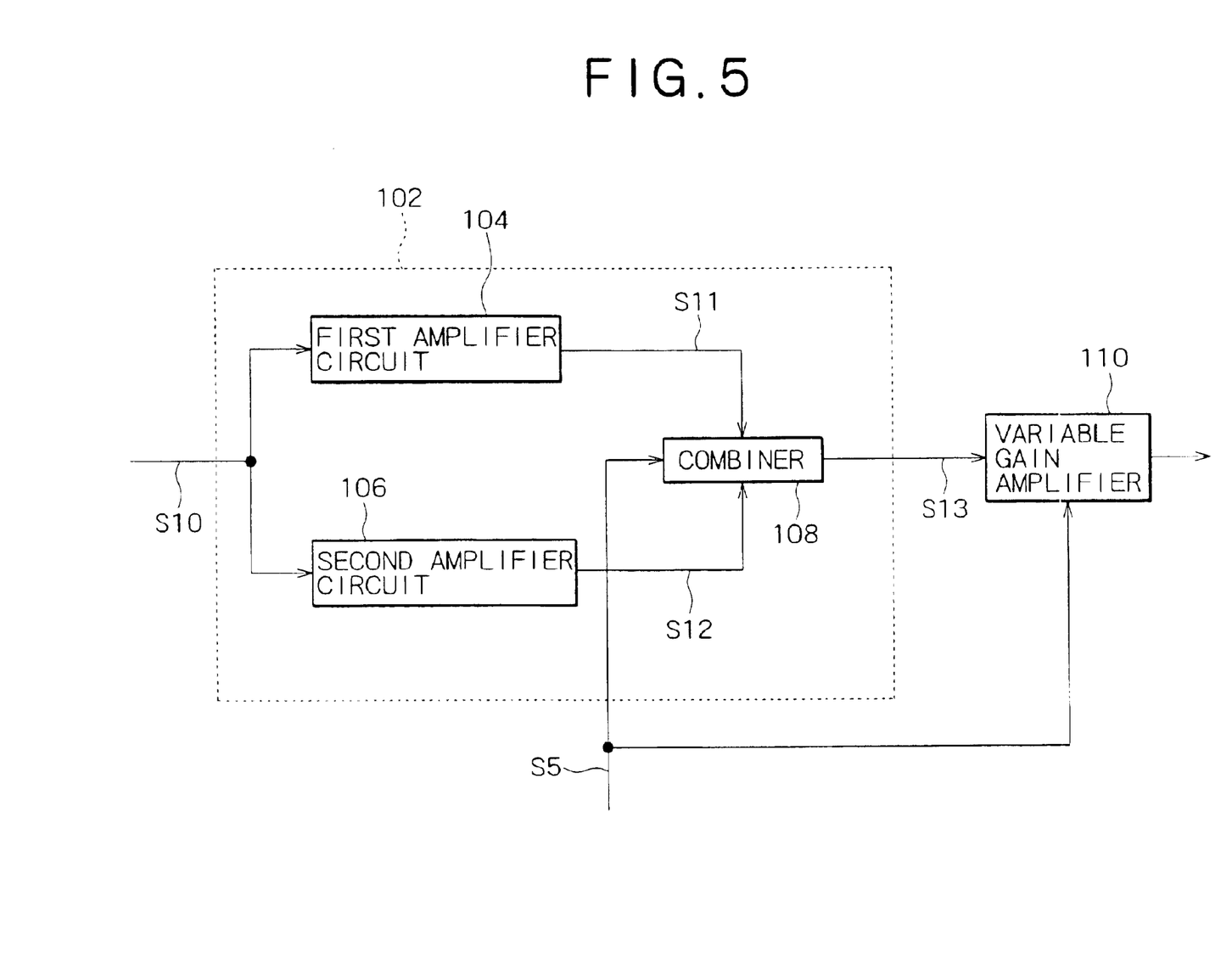
FIG. 5 is a block diagram showing an example of a conventional variable gain amplifier.

FIG. 5 is a block diagram showing an example of this type of conventional variable gain amplifier.

A variable gain amplifier 102 shown in FIG. 5 includes a first amplifier circuit 104 having good noise characteristics and a high gain and a second amplifier circuit 106 having a high input saturation level and a low gain. A signal S10 is inputted commonly to the first and second amplifier circuits 104 and 106. Output signals S11 and S12 of the first and second amplifier circuits 104 and 106 are combined with each other for output by a combiner 108.

When the gain of the variable gain amplifier 102 is to be increased, the combiner 108 provides a relatively large weight to the output signal S11 of the first amplifier circuit 104 on the basis of a gain control signal S5 and then adds the two output signals S11 and S12 to each other. As a result, the output signal of the combiner 108, that is, an output signal S13 of the variable gain amplifier 102, reflects the output signal of the first amplifier circuit 104 more strongly. Thus, the gain of the variable gain amplifier 102 is increased. On the other hand, when the gain of the variable gain amplifier 102 is to be decreased, the combiner 108 provides a relatively small weight to the output signal S11 of the first amplifier circuit 104 and then adds the two output signals S11 and S12 to each other. As a result, the output signal S13 of the variable gain amplifier 102 reflects the output signal of the second amplifier circuit 106 more strongly. Thus, the gain of the variable gain amplifier 102 is decreased.

In FIG. 5, the output signal S13 of the variable gain amplifier 102 is inputted to a variable gain amplifier 10 in a second stage so that the level of the signal is further controlled. Therefore, the overall gain is changed more, and thus the level of the signal is controlled in a wider range. Of course, it is possible to connect another variable gain amplifier subsequent to the variable gain amplifier 110.

Figure 6:
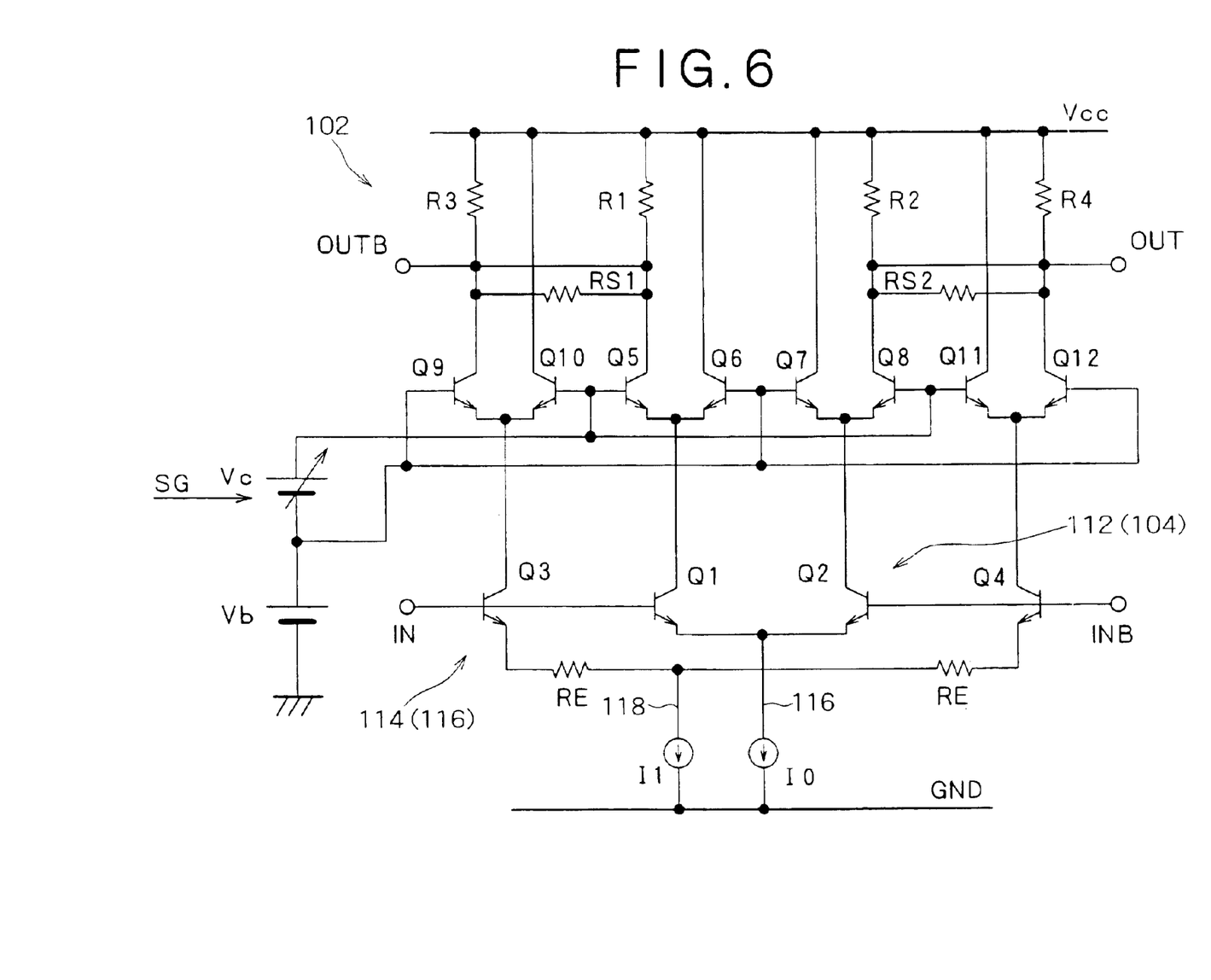
FIG. 6 is a circuit diagram showing in detail the variable gain amplifier of FIG. 5.

FIG. 6 is a circuit diagram showing in detail the variable gain amplifier 102 of FIG. 5.

As shown in FIG. 6, the first amplifier circuit 104 is formed by a first differential amplifier circuit 112 including transistors Q1 and Q2, a constant current source 10, resistances R1 and R2 and the like. The second amplifier circuit 106 is formed by a second differential amplifier circuit 114 including transistors Q3 and Q4, a constant current source 11, resistances R3 and R4 and the like.

Bases of the transistors Q1 and Q2 forming the first differential amplifier circuit 112 are connected to input terminals IN and INB, respectively, and emitters of the transistors Q1 and Q2 are both connected to one end of a current path 116. The resistances R1 and R2 are load resistances of the transistors Q1 and Q2, and one end of each of the resistances is connected to a positive power supply Vcc. Another end of the current path 116 is connected to a ground, and the constant current source 10 is inserted at a midpoint on the current path 116.

Bases of the transistors Q3 and Q4 forming the second differential amplifier circuit 114 are connected to input terminals IN and INB, respectively, and emitters of the transistors Q3 and Q4 are both connected to one end of a current path 118 via a resistance RE. The resistances R3 and R4 are load resistances of the transistors Q3 and Q4, and one end of each of the resistances is connected to the power supply Vcc. Another end of the current path 118 is connected to the ground, and the constant current source 11 is inserted at a midpoint on the current path 118.

The combiner 108 is formed by transistors Q5 to Q12, resistances RS1 and RS2, a voltage source Vb, and a variable voltage source Vc. The pairs of transistors Q5 and Q6, transistors Q7 and Q8, transistors Q9 and Q10, and transistors Q11 and Q12 have emitters connected to collectors of the transistors Q1 to Q4, respectively. Collectors of the transistors Q5, Q8, Q9, and Q12 are connected to the other ends of the resistances R1, R2, R3, and R4, respectively. Collectors of the transistors Q6, Q7, Q10, and Q11 are connected to the power supply Vcc.

Bases of the transistors Q6, Q7, Q9, and Q12 are each connected to a cathode of the voltage source Vb, and bases of the transistors Q5, Q8, Q10, and Q11 are each connected to a cathode of the variable voltage source Vc. An anode of the variable voltage source Vc is connected to the cathode of the voltage source Vb, and an anode of the voltage source Vb is connected to the ground. The two resistances RS1 and RS2 are connected between the collectors of the transistors Q5 and Q9 and between the collectors of the transistors Q8 and Q12, respectively.

The collectors of the transistors Q5 and Q8 are connected to output terminals OUTB and OUT of the variable gain amplifier 102, respectively. With such a configuration, when the voltage of the variable voltage source Vc is controlled by a gain control signal SG (corresponding to S5 in FIG. 5) to set the voltage of the variable voltage source to a sufficiently high positive value, for example, the transistors Q5, Q8, Q10, and Q11 are brought into an on state, and the transistors Q6, Q7, Q9, and Q12 are brought into an off state. Therefore, the output signals of the second differential amplifier circuit 114 outputted from the collectors of the transistors Q3 and Q4 are blocked by the transistors Q9 and Q12, so that the output signals of the second differential amplifier circuit are not added to the output signals of the first differential amplifier circuit 112 via the resistances RS1 and RS2. Thus, only the output signals of the first differential amplifier circuit 112 are outputted from the output terminals OUTB and OUT via the transistors Q5 and Q8.

On the other hand, when the voltage of the variable voltage source Vc is set to a negative value of a sufficiently high magnitude, the transistors Q5, Q8, Q10, and QI1 are"

brought into an off state, and the transistors Q6, Q7, Q9, and Q12 are brought into an on state. Therefore, the output signals of the first differential amplifier circuit 112 outputted from the collectors of the transistors Q1 and Q2 are blocked by the transistors Q5 and Q8, so that the output signals of the first differential amplifier circuit art not added to the output signals of the second differential amplifier circuit 114 supplied via the resistances RS1 and RS2. Thus, only the output signals of the second differential amplifier circuit 114 are outputted from the output terminals OUTB and OUT.

When the voltage of the variable voltage source Vc is set to an intermediate voltage, the collector currents of the transistors Q5, Q8, Q9, and Q12 have current values corresponding to the voltage of the variable voltage source Vc. Accordingly, the output signals of the first and second differential amplifier circuits 112 and 114 are subjected to weighted addition corresponding to the voltage of the variable voltage source, and the results are outputted from the output terminals OUTB and OUT. As the voltage of the variable voltage source Vc is increased, the weight given to the output signals of the first differential amplifier circuit 112 becomes larger, and hence signals that reflect the output signals of the first differential amplifier circuit 112 more strongly are outputted from the output terminals OUTB and OUT.

The first differential amplifier circuit 112 has a higher gain than the second differential amplifier circuit 114. Hence, as the voltage of the variable voltage source Vc is increased, the gain of the variable gain amplifier 102 is increased, while as the voltage of the variable voltage source Vc is decreased, the gain of the variable gain amplifier 102 is decreased.

Since the emitters of the transistors Q1 and Q2 are connected directly to each other and no emitter resistance is inserted, resistance thermal noise does not occur in the first differential amplifier circuit 112, so that the first differential amplifier circuit 112 has a good SN ratio. On the other hand, the second differential amplifier circuit 114 has the emitter resistances RE connected to the transistors Q3 and Q4. Although the second differential amplifier circuit 114 has a low SN ratio, the second differential amplifier circuit 114 has a higher saturation input level than the first differential amplifier circuit 112.

Thus, the variable gain amplifier 102 provides a good SN ratio when the gain of the variable gain amplifier 102 is increased, whereas the variable gain amplifier 102 has a higher saturation input level to prevent or reduce signal distortion when the gain of the variable gain amplifier 102 is decreased.

Whatever magnitude the gain set in the conventional variable gain amplifier 102 described above has, the constant current sources 10 and 11 feed the current paths 116 and 118 with constant currents as bias currents of the first and second differential amplifier circuits 112 and 114 at all times. In this respect, there is room for a reduction of power consumption. The reduction of power consumption of an electronic apparatus, such as a communication apparatus, and is an important challenge to be dealt with constantly simultaneously with the reduction of the size and weight of the apparatus.

SUMMARY OF THE INVENTION

It is an object of the present invention to provide a variable gain amplifier with a reduced power consumption.

In order to achieve the above object, according to the present invention, there is provided a variable gain amplifier which includes a first differential amplifier circuit and a second differential amplifier circuit supplied with a common input signal, a combining circuit for combining output signals of the first differential amplifier circuit and the second differential amplifier circuit with each other, the first differential amplifier circuit and the second differential amplifier circuit each including a first transistor and a second transistor forming a differential pair, the first transistor and the second transistor having bases supplied with the input signal and collectors outputting signals to the combining circuit, and the first differential amplifier circuit and the second differential amplifier circuit having amplification degrees different from each other, and a current control circuit for changing the ratio between the bias current of the first differential amplifier circuit and the bias current of the second differential amplifier circuit on the basis of a gain control signal.

As is well known, the gain of a differential amplifier circuit is changed with the magnitude of a bias current thereof, i.e., the lower the bias current, the lower the gain, and the greater the bias current, the higher the gain. With the variable gain amplifier according to the present invention, in a case where the gain of the first differential amplifier circuit is higher than the gain of the second differential amplifier circuit, when the gain of the variable gain amplifier is to be increased, a gain control signal is supplied to the current control circuit to effect control to increase the ratio of the bias current of the first differential amplifier circuit so that the gain of the first differential amplifier circuit having a high gain is raised and the gain of the second differential amplifier circuit having a low gain is lowered.

On the other hand, when the gain of the variable gain amplifier is to be decreased, a gain control signal is supplied to the current control circuit to effect control to increase the ratio of the bias current of the second differential amplifier circuit so that the gain of the first differential amplifier circuit having a high gain is lowered and the gain of the second differential amplifier circuit having a low gain is raised.

Thus, according to the present invention, the bias current of the second differential amplifier circuit is reduced when the gain of the variable gain amplifier is increased, whereas the bias current of the first differential amplifier circuit is reduced when the gain of the variable gain amplifier is decreased. It is therefore possible to reduce power consumption as compared with a case where the bias currents of the first and second differential amplifier circuits are constant at all times, as has been conventional.

DETAILED DESCRIPTION OF PREFERRED EMBODIMENTS

Preferred embodiments of the present invention will next be described with reference to the drawings.

Figure 1:
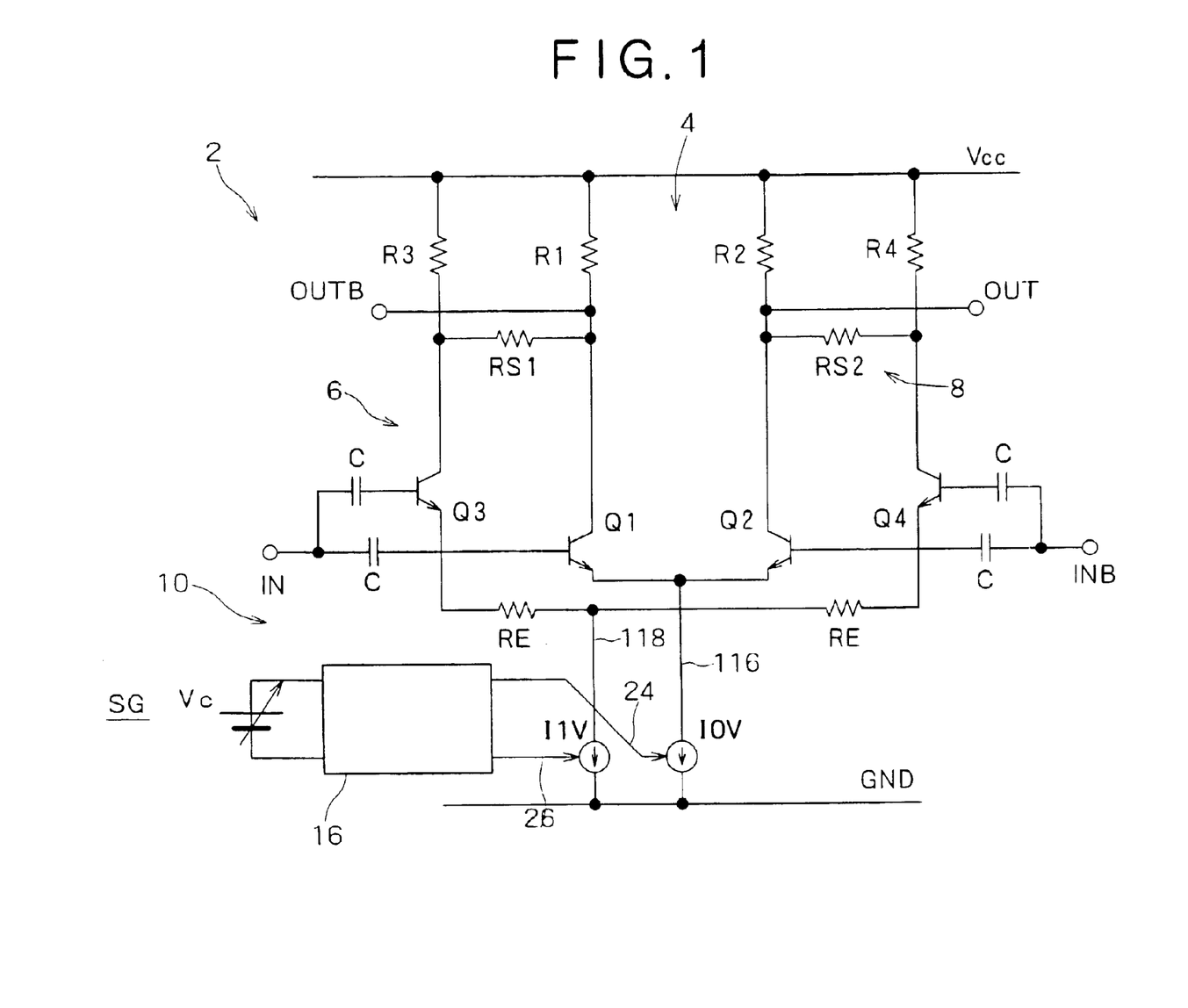
FIG. 1 is a circuit diagram showing an example of a variable gain amplifier according to the present invention.
Figure 2:
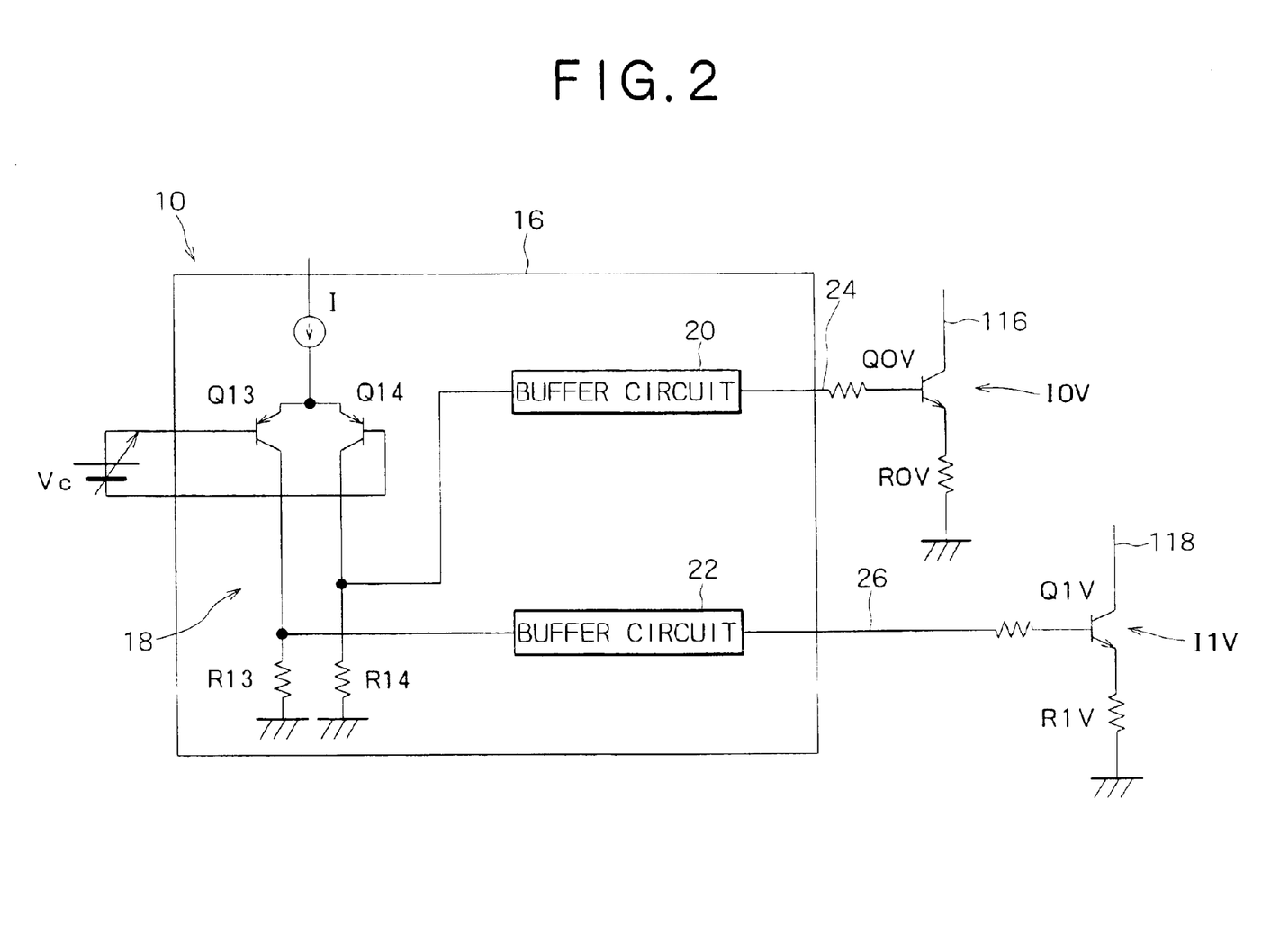
FIG. 2 is a circuit diagram showing in detail a current control circuit and a periphery thereof forming the variable gain amplifier of FIG. 1.

FIG. 1 is a circuit diagram showing an example of a variable gain amplifier according to the present invention. FIG. 2 is a circuit diagram showing in detail a current control circuit and a periphery thereof forming the variable gain amplifier of FIG. 1. In the figures, the same components as in FIG. 6 are identified by the same reference numerals.

As shown in FIG. 1, the variable gain amplifier 2 according to the present embodiment includes a first and a second differential amplifier circuits 4 and 6, a combining circuit 8, the current control circuit 10 and the like.

The first differential amplifier circuit 4 includes transistors Q1 and Q2, a variable current source I0V, resistances R1 and R2 and the like. Bases of the transistors Q1 and Q2 are connected to input terminals IN and INB, respectively, each via a capacitor C, and emitters of the transistors Q1 and Q2 are both connected to one end of a current path 116. Another end of the current path 116 is connected to a ground, and the variable current source I0V is inserted at a midpoint on the current path 116. The resistances R1 and R2 are connected between collectors of the transistors Q1 and Q2, respectively, and a positive power supply Vcc.

On the other hand, the second differential amplifier circuit 6 includes transistors Q3 and Q4, a variable current source I1V, resistances R3 and R4 and the like. Bases of the transistors Q3 and Q4 are connected to the input terminals IN and INB, respectively, each via a capacitor C, and emitters of the transistors Q3 and Q4 are both connected to one end of a current path 118 each via a resistance RE. Another end of the current path 118 is connected to the ground, and the variable current source I1V is inserted at a midpoint on the current path 118. The resistances R3 and R4 are connected between collectors of the transistors Q3 and Q4, respectively, and the power supply Vcc.

The collectors of the transistors Q1 and Q2, that is, outputs of the first differential amplifier circuit 4 are connected to output terminals OUTB and OUT of the variable gain amplifier 2, respectively, and the collectors of the transistors Q3 and Q4, that is, outputs of the second differential amplifier circuit 6 are connected to the collectors of the transistors Q1 and Q2 via resistances RS1 and RS2, respectively. The resistances RS1 and RS2 form the combining circuit 8.

Since the emitters of the transistors Q1 and Q2 are connected directly to the current source I0V and no emitter resistance is inserted, resistance thermal noise does not occur in the first differential amplifier circuit 4, so that the first differential amplifier circuit 4 prides a high SN ratio and a high gain. On the other hand, the second differential amplifier circuit 6 has the emitter resistances RE connected to the transistors Q3 and Q4. Although the second differential amplifier circuit 6 has a low SN ratio, the second differential amplifier circuit 6 has a saturation input level higher than the first differential amplifier circuit 4 and a low gain.

The current control circuit 10 includes a variable voltage source Vc and a current control circuit proper 16. As shown in FIG. 2, the current control circuit proper 16 includes a differential pair circuit 18 and buffer circuits 20 and 22. The differential pair circuit 18 includes PNP-type transistors Q13 and Q14, a constant current source I, and resistances R13 and R14. A current from the constant-current source I is supplied to emitters of the transistors Q13 and Q14, and collectors of the transistors Q13 and Q14 are connected to the ground via the resistances R13 and R14, respectively. The variable voltage source Vc is connected between bases of the transistors Q13 and Q14 with a cathode connected to the base side of the transistor Q13.

The variable current source I0V includes a transistor Q0V and a resistance R0V, and the variable current source I1V includes a transistor Q1V and a resistance R1V. Collectors of the transistors Q0V and Q1V are connected to the emitters of the transistors Q1 and Q2 shown in FIG. 1 and a common connection point of the resistances RE via the current paths 116 and 118, respectively. Emitters of the transistors Q0V and Q1V are connected to the ground through the resistances R0V and R1V, respectively.

Output voltages of the differential pair circuit 18, that is, collector voltages of the transistors Q13 and Q14, are applied through the buffer circuits 20 and 22 to bases of the transistors Q0V and Q1V, that is, control terminals 24 and 26 of the variable current sources I0V and I1V, respectively. Thus, when a voltage of the variable voltage source Vc is positive (voltage on the cathode side is higher than the anode side), the collector voltage of the transistor Q14 is higher than the collector voltage of the transistor Q13, and the voltages are applied through the buffer circuits 20 and 22 to the bases of the transistors Q0V and Q1V, respectively, so that a current of the variable current source I0V is greater than a current of the variable current source I1V. On the other hand, when the voltage of the variable voltage source Vc is negative (voltage on the cathode side is lower than the anode side), the collector voltage of the transistor Q14 is lower than the collector voltage of the transistor Q13, so that the current of the variable current source I1V is greater than the current of the variable current source I0V.

Incidentally, in FIG. 1, resistance for supplying bias voltage to the bases of the transistors Q1 to Q4 is omitted in order to avoid greater complexity of the figure than is necessary.

Operation of the thus-formed variable gain amplifier 2 will be described next.

The gain of a differential amplifier circuit is changed with the magnitude of a bias current thereof, i.e., the lower the bias current, the lower the gain, and the greater the bias current, the higher the gain.

In the variable gain amplifier 2 according to the present embodiment, when the gain of the whole (variable gain amplifier) is to be increased, a gain control signal SG is supplied to the variable voltage source Vc to set the voltage of the variable voltage source Vc to a high value. As a result, the voltage of the control terminal 24 of the variable current source I0V is raised relative to the voltage of the control terminal 26 of the variable current source I1V, and the current fed through the current path 116 by the variable current source I0V (a sum of emitter currents of the transistors Q1 and Q2, that is, a bias current) is increased relative to the current fed through the current path 118 by the variable current source I1V (a sum of emitter currents of the transistors Q3 and Q4, that is, a bias current) (that is, the ratio of the current of the current path 116 is increased). Thereby, the gain of the first differential amplifier circuit 4 having a high gain is increased, and thus the gain of the variable gain amplifier 2 is increased. Incidentally, in this case, the gain of the second differential amplifier circuit 6 is decrease; however, since the gain of the second differential amplifier circuit 6 is low, the decrease in the gain of the second differential amplifier circuit 6 has little effect. Hence, the overall gain is increased, as described above.

The gain of the variable gain amplifier 2 is set to a high value when the signal level of input signals is low. In this case, the first differential amplifier circuit 4 having a high SN ratio plays a dominant role in the operation in the variable gain amplifier 2. Therefore, a low-level signal can be amplified at a high SN ratio.

On the other hand, when the gain of the variable gain amplifier 2 is to be decreased, a gain control signal SG is supplied to the variable voltage source Vc to set the voltage of the variable voltage source Vc to a low value (for example the voltage on the cathode side of the variable voltage source Vc is lower than on the anode side). As a result, the voltage of the control terminal 24 of the variable current source I0V is lowered relative to the voltage of the control terminal 26 of the variable current source I1V, and the current fed through the current path 116 by the variable current source I0V is decreased relative to the current fed through the current path 118 by the variable current source I1V. Thereby, the gain of the first differential amplifier circuit 4 having a high gain is decreased, and the gain of the second differential amplifier circuit 6 having a low gain is increased. Hence, the overall gain is decreased.

The gain of the variable gain amplifier 2 is set to a low value when the signal level of input signals is high. In this case, the second differential amplifier circuit 6 having a high saturation input level plays a dominant role in the operation in the variable gain amplifier 2. Therefore, a signal can be amplified without causing signal distortion.

Thus, when the input signal level is low and the gain of the variable gain amplifier 2 according to the present embodiment is set to a high value, the variable gain amplifier 2 according to the present embodiment reduces the current flowing through the second differential amplifier circuit 6 that does not contribute much to increasing the gain. On the other hand, when the input signal level is high and the gain of the variable gain amplifier 2 is set to a low value, the variable gain amplifier 2 educes the current flowing through the first differential amplifier circuit 4 that does not contribute to increasing the saturation input level. It is therefore possible to reduce power consumption as compared with a case where the bias currents of the first and second differential amplifier circuits 4 and 6 are constant at all times, as has been conventional.

Figure 3:
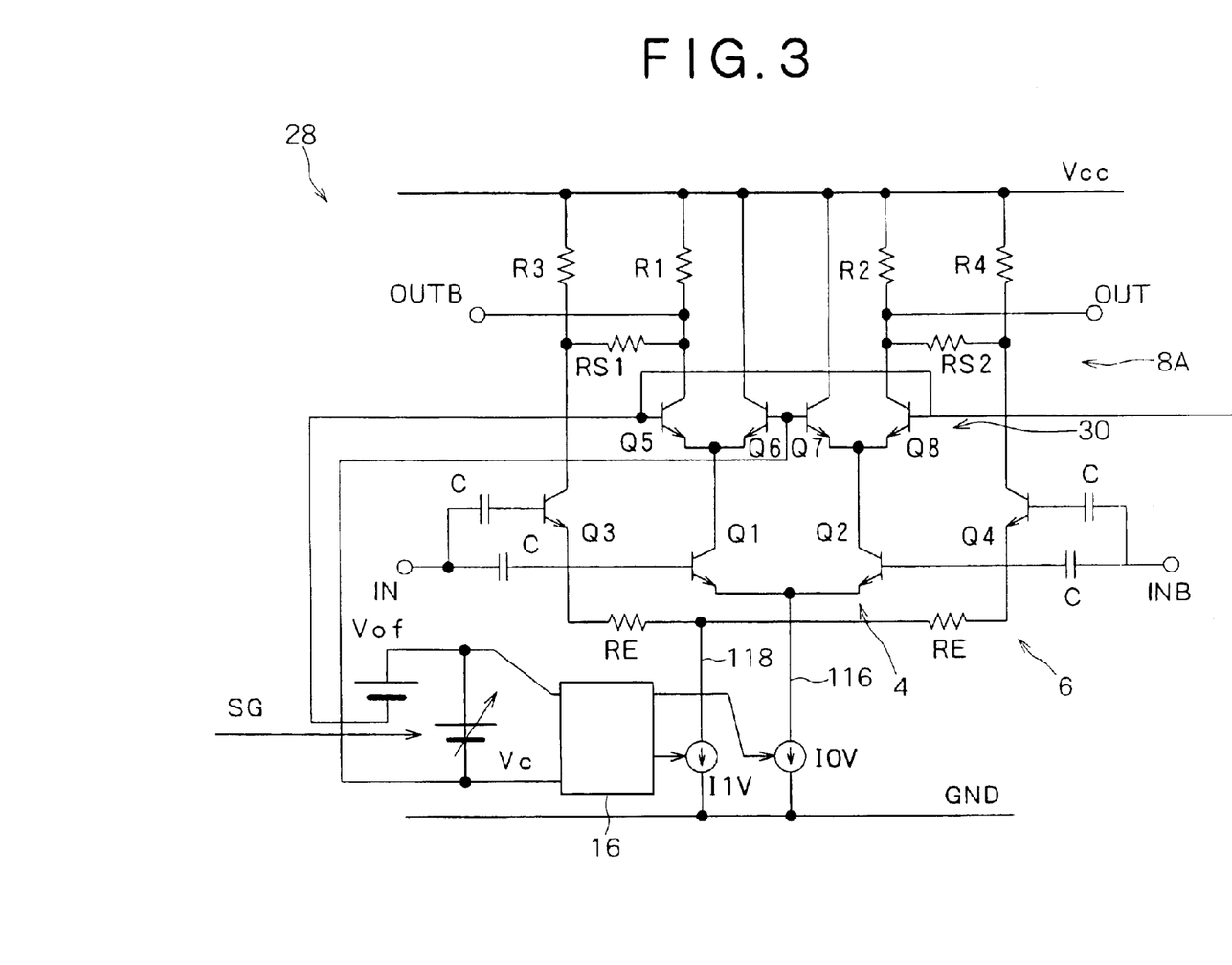
FIG. 3 is a circuit diagram showing a variable gain amplifier according to a second embodiment.

A second embodiment of the present invention will be described next FIG. 3 is a circuit diagram showing a variable gain amplifier according to the second embodiment. In the figure, the same components as in FIG. 1 are identified by the same reference numerals, and a detailed description thereof will be omitted in the following.

The variable gain amplifier 28 shown in FIG. 3 is different from the variable gain amplifier 2 in that the combining circuit 8 is replaced with a combining circuit 8A and a voltage source Vof is added. This prevents a degradation in frequency characteristics when the gain of a first differential amplifier circuit 4 is lowered.

A combiner 30 is added in the combining circuit 8A. The combiner 30 is inserted between the collectors of transistors Q1 and Q2 and the resistances R1 and R2 and is formed by transistors Q5 to Q8. Emitters of the transistors Q5 and Q6 are connected to the collector of the transistor Q1. A collector of the transistor Q5 is connected to a node that connects the resistance R1 and a resistance RS1 to each other. A collector of the transistor Q6 is connected to a power supply Vcc. Emitters of the transistors Q7 and Q8 are connected to the collector of the transistor Q2. A collector of the transistor Q8 is connected to a node that connects the resistance R2 and a resistance RS2 to each other. A collector of the transistor Q7 is connected to the power supply Vcc.

Bases of the transistors Q5 and Q8 are both connected to an anode of an offset voltage source Vof. A cathode of the offset voltage source Vof is connected to a cathode of a variable voltage source Vc. Bases of the transistors Q6 and Q7 are connected to an anode of the variable voltage source Vc.

Operation of the thusformed variable gain amplifier 28 will be described next.

Suppose that the offset voltage source Vof is not inserted and the bases of the transistors Q5 and Q8 are connected directly to the variable voltage source Vc. When a voltage of the variable voltage source Vc is lowered to decrease a gain of the variable gain amplifier 28, the currents of variable current sources I0V and I1V are changed as described above, and, at the same time, base voltages of the transistors Q5 and Q8 are lowered, whereby collector currents of the transistors Q5 and Q8 are decreased. Hence, this is equivalent to multiplying output signals of the first differential amplifier circuit 4 by a small weight when the output signals of the first differential amplifier circuit 4 at the collectors of the transistors Q5 and Q8 are added to output signals of the second differential amplifier circuit 6 supplied through the resistances RS1 and RS2. Thus, signals that reflect the output signals of the second differential amplifier circuit 6 more strongly are outputted from output terminals OUTB and OUT.

In the second embodiment, the offset voltage source Vof is connected as described above. In a range where the voltage of the variable voltage source Vc is sufficiently higher than a voltage of the offset voltage source Vof, the base voltages of the transistors Q5 and Q8 are sufficiently higher than base voltages of the transistors Q6 and Q7, and the transistors Q5 and Q8 are in an on state, so that the effect as described above is not produced. However, when the voltage of the variable voltage source Vc is lowered close to the voltage of the offset voltage source Vof, the weighting effect is produced, so that signals that reflect the output signals of the second differential amplifier circuit 6 more are outputted from the output terminals OUTB and OUT.

Hence, when the gain of the variable gain amplifier 28 is decreased to a certain level or lower, the variable gain amplifier 28 can lower the degree of effect of the first differential amplifier circuit 4 on output signals. Thus, the effects of a frequency bandwidth of the first differential amplifier circuit 4 being narrowed as a result of a decrease in the gain of the first differential amplifier circuit 4 are lessened, whereby the frequency characteristics of the variable gain amplifier 28 as a whole are maintained in a favorable state.

Since the gain of the first differential amplifier circuit 4 is higher than the gain of the second differential amplifier circuit 6, the frequency characteristics of the first differential amplifier circuit 4 have great effect on the frequency characteristics of the variable gain amplifier. Accordingly, it is effective to use such a technique for lessening the effect of degradation in the frequency characteristics of the first differential amplifier circuit 4.

It is to be noted that while the second embodiment reduces the ratio of output of the first differential amplifier circuit 4 by means of the combiner 30, a similar combiner may be disposed at output portions of the transistors Q3 and Q4, for example, to increase the ratio of output of the second differential amplifier circuit 6, or a combiner may be disposed at output portions of both the first and second differential amplifier circuits 4 and 6 to reduce the ratio of output of the first differential amplifier circuit 4 and, at the same time, increase the ratio of output of the second differential amplifier circuit 6.

A third embodiment of the present invention will be described next.

Figure 4:
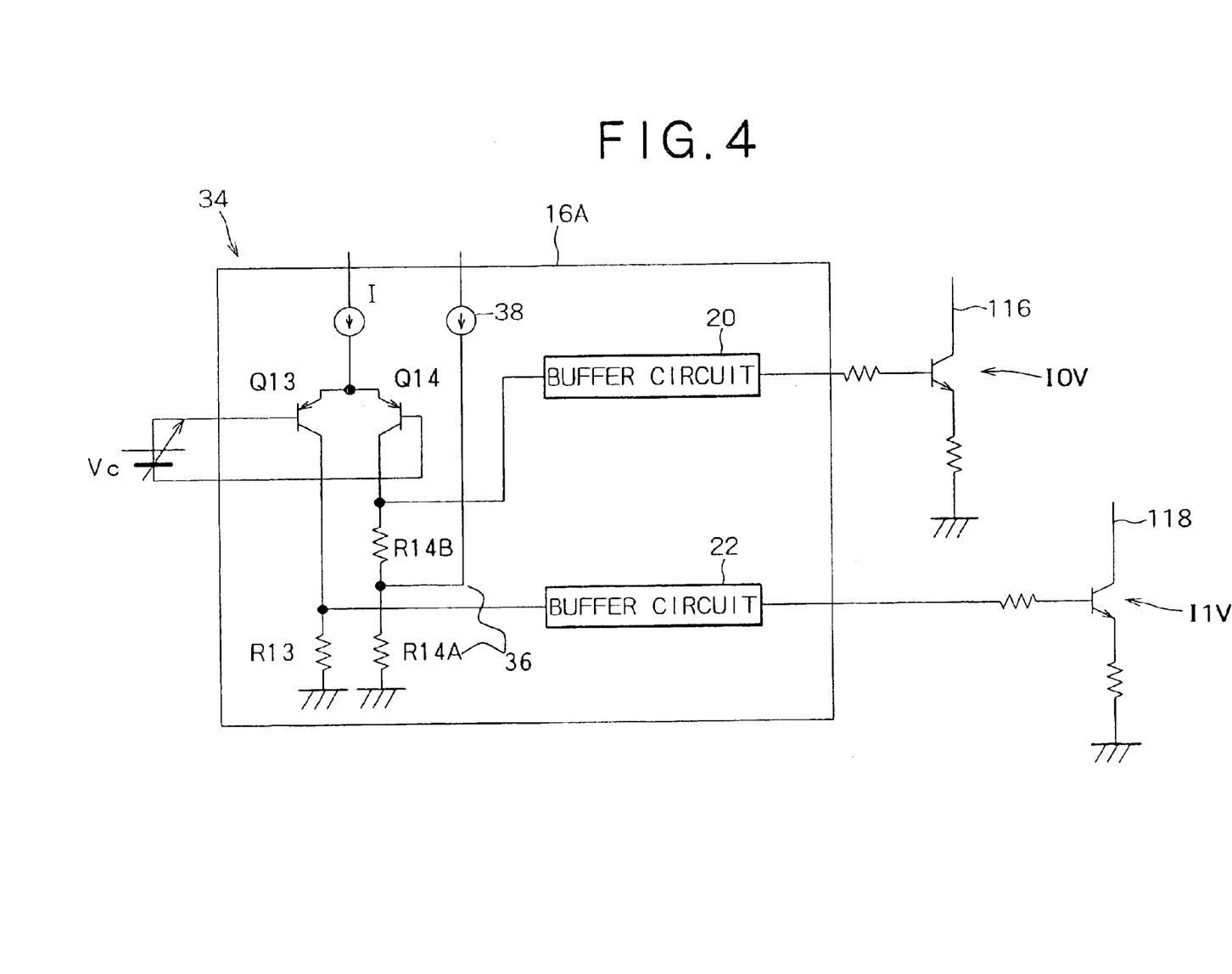
FIG. 4 is a circuit diagram showing a current control circuit forming a variable gain amplifier according to a third embodiment.

FIG. 4 is a circuit diagram showing a current control circuit forming a variable gain amplifier according to the third embodiment. In the figure, the same components as in FIG. 2 are identified by the same reference numerals, and a description thereof will be omitted in the following.

The current control circuit 34 shown in FIG. 4 is different from the current control circuit 10 shown in FIG. 2 in that a current control circuit proper 16A is provided with a current regulating circuit 36. The current regulating circuit 36 includes a constant current source 38 and a resistance R14A. Other parts of the variable gain amplifier according to the third embodiment are the same as in the variable gain amplifier 2 described above.

In the current control circuit 10 shown in FIG. 2, when the voltage of the variable voltage source Vc is lowered to decrease the gain of the first differential amplifier circuit 4 (FIG. 1), the collector voltage of the transistor Q14 is lowered without limit, and therefore the current supplied by the current source I0V also is decreased without limit. When the bias current of the first differential amplifier circuit 4 is decreased, the frequency characteristics of the first differential amplifier circuit 4 are degraded, as described above. Since the gain of the first differential amplifier circuit 4 is higher than that of the second differential amplifier circuit 6, the frequency characteristics of the first differential amplifier circuit 4 have great effect on the frequency characteristics of the variable gain amplifier as a whole.

In a case where the current regulating circuit 36 is provided as in the current control circuit 34 according to the third embodiment, even if the voltage of a variable voltage source Vc is lowered to bring a transistor Q14 into an off state, a current is supplied from the constant current source 38 to the resistance R14A to maintain the collector voltage of the transistor Q14 at a constant value. Therefore, the bias current of a first differential amplifier circuit 4 is prevented from decreasing to a certain value or lower.

Thus, the third embodiment can control degradation in the frequency characteristics of the first differential amplifier circuit 4 even when the gain is lowered substantially. It is thereby possible to avoid substantial degradation in the frequency characteristics of the variable gain amplifier as a whole.

Incidentally, a value of a series resistance of the resistance R14A and a resistance R14B in the current control circuit 34 can be set to be equal to a resistance value of the resistance R14 (FIG. 2), for example.

The third embodiment changes the bias current of each of the first and second differential amplifier circuits 4 and 6 by controlling current sources I0V and I1V forming the differential amplifier circuits. In addition to such a method, the bias current can be changed also by controlling the base current of transistors forming each of the differential amplifier circuits, for example.

Furthermore, while the first and second differential amplifier circuits 4 and 6 in the third embodiment are formed with the current sources I0V and I1V, the current sources may of course be replaced by resistance. In that case, the second differential amplifier circuit 6 may be configured such that emitters of transistors Q3 and Q4 are connected via a single resistance and the emitters are connected to a ground via different resistances, for example.

As described above, with the variable gain amplifier according to the present invention, in a case where the gain of the first differential amplifier circuit is higher than the gain of the second differential amplifier circuit, when the gain of the variable gain amplifier is to be increased, a gain control signal is supplied to the current control circuit to effect control to increase the ratio of the bias current of the first differential amplifier circuit so that the gain of the first differential amplifier circuit having a high gain is raised and the gain of the second differential amplifier circuit having a low gain is lowered.

On the other hand, when the gain of the variable gain amplifier is to be decreased, a gain control signal is supplied to the current control circuit to effect control to increase the ratio of the bias current of the second differential amplifier circuit so that the gain of the first differential amplifier circuit having a high gain is lowered and the gain of the second differential amplifier circuit having a low gain is raised.

Thus, according to the present invention, the bias current of the second differential amplifier circuit is reduced when the gain of the variable gain amplifier is increased, whereas the bias current of the first differential amplifier circuit is reduced when the gain of the variable gain amplifier is decreased. It is therefore possible to reduce power consumption as compared with a case where the bias currents of the first and second differential amplifier circuits are constant at all times, as has been conventional.

While the preferred embodiments of the present invention have been described using specific terms, such description is for illustrative purposes only, and it is to be understood that changes and variations may be made without departing from the spirit or scope of the following claims.

What is claimed is:

1. A variable gain amplifier comprising:
   a first differential amplifier circuit and a second differential amplifier circuit supplied with a common input signal first and second current sources;
   a combining circuit for combining output signals of said first differential amplifier circuit and said second differential amplifier circuit wherein, said first differential amplifier circuit and said second differential amplifier circuit each including a first transistor and a second transistor forming a differential pair, said first transistor and said second transistor having bases supplied with said input signal and collectors outputting signals to said combining circuit, and said first differential amplifier circuit and said second differential amplifier circuit having amplification degrees different from each other, wherein in the second differential amplifier a first resistor is connected between the first transistor and the second current source and a second resistor is connected between the second transistor and the second current source; and
   a current control circuit for changing a ratio between the current of the first current source of said first differential amplifier circuit and the current of the second current source of said second differential amplifier circuit based on a gain control signal, said current control circuit having a constant current source and a third resistor are series connected to the collector of a third transistor.

2. A variable gain amplifier as claimed in claim 1, wherein said first differential amplifier circuit has a higher gain than said second differential amplifier circuit; and said current control circuit sets said bias current of said second differential amplifier circuit relatively low when a gain of the variable gain amplifier is increased, and sets said bias current of said first differential amplifier circuit relatively low when the gain of the variable gain amplifier is decreased.

3. A variable gain amplifier as claimed in claim 1, wherein emitters of said first transistor and said second transistor of said first differential amplifier circuit are directly connected to each other and connected to a current path at a first potential point; and emitters of said first transistor and said second transistor of said second differential amplifier circuit are connected to each other via resistances and connected at a current path to said second potential point.

4. A variable gain amplifier as claimed in claim 1, wherein the collectors of said first transistors and said second transistors of said first differential amplifier circuit and said second differential amplifier circuit are connected to a second potential point via a resistance.

5. A variable gain amplifier as claimed in claim 1, wherein said combining circuit includes:

a resistance for connecting the collectors of said first transistors of said first differential amplifier circuit and said second differential amplifier circuit to each other; and a resistance for connecting the collectors of said second transistors of said first differential amplifier circuit and said second differential amplifier circuit to each other.

6. A variable gain amplifier as claimed in claim 5, wherein a signal after combination is outputted from the collectors of said first transistor and said second transistor of said first differential amplifier circuit.

7. A variable gain amplifier as claimed in claim 1, wherein said combining circuit adds a weighted value to at least one of the output signal of said first differential amplifier circuit and the output signal of said second differential amplifier circuit, and then combines the two output signals with each other; and when said current control circuit sets a gain of the variable gain amplifier low, said combining circuit adds the weighted value to lower a ratio of a bias current of said first differential amplifier circuit so that the output signal of said first differential amplifier circuit is reduced.

8. A variable gain amplifier as claimed in claim 1, wherein said current control circuit includes a current regulating circuit to maintain said bias current of said first differential amplifier circuit above a predetermined reference value.

9. A variable gain amplifier as claimed in claim 1, further including a differential pair circuit for controlling said bias current of said first differential amplifier circuit and said bias current of said second differential amplifier circuit, wherein a variable voltage source is connected between control terminals of transistors forming said differential pair circuit.

* * * * *